July 14, 1964 C. N. PAGANO 3,141,136

FEEDBACK AMPLIFIER GATE

Filed July 3, 1958

Inventor
CARMINE N. PAGANO
By Philip M. Bolton
Attorney

United States Patent Office 3,141,136 Patented July 14, 1964

3,141,136

FEEDBACK AMPLIFIER GATE

Carmine N. Pagano, Long Island City, N.Y., assignor to International Telephone and Telegraph Corporation, Nutley, N.J., a corporation of Maryland Filed July 3, 1958, Ser. No. 747,556
3 Claims. (Cl. 328—158)

This invention relates to electrical gating systems and particularly to a system for gating the summing junction of a negative feedback amplifier so that the output of said amplifier is attenuated.

In some applications it is desirable to remove unwanted signals from the input to a feedback amplifier with a gate that clamps the grid or summing junction of the amplifier to ground during controlled intervals. However, several problems arise in grounding the grid of a feedback amplifier and one of these is that negative feedback becomes ineffective and, secondly, a dead short-to-ground at the summing junction is practically impossible due to a voltage drop through the gate to ground, thus, the output of said amplifier is not properly attenuated when such a summing junction gate-to-ground closes.

Therefore, it is the principal object of this invention to provide improved means for gating the summing junction of a feedback amplifier whereby the output of said amplifier is attenuated.

It is another object to provide means for reducing the gain of a feedback-type amplifier during controlled intervals.

It is another object to provide simple gating means at the input to a feedback amplifier for reducing the gain of the amplifier by a predetermined amount during controlled intervals.

It is another object to provide gating means for grounding a junction, which has a minimum impedance to ground so that a near dead short-to-ground is obtained at the junction.

It is a feature of this invention to employ a feedback amplifier having a feedback impedance coupling its input and output and input signals feeding input currents to a common junction and to couple said common junction to the input of said amplifier by means of an impedance so that gating means coupled to said common junction for placing said junction at ground potential results in attenuating the output of said amplifier by a predetermined factor.

It is another feature to employ unidirectional conductive devices coupling said junction to voltage dividers and control means coupled to said voltage dividers whereby the potential of said junction may vary between predetermined positive and negative values or may be brought to ground level by the action of said control means.

Figure 1:
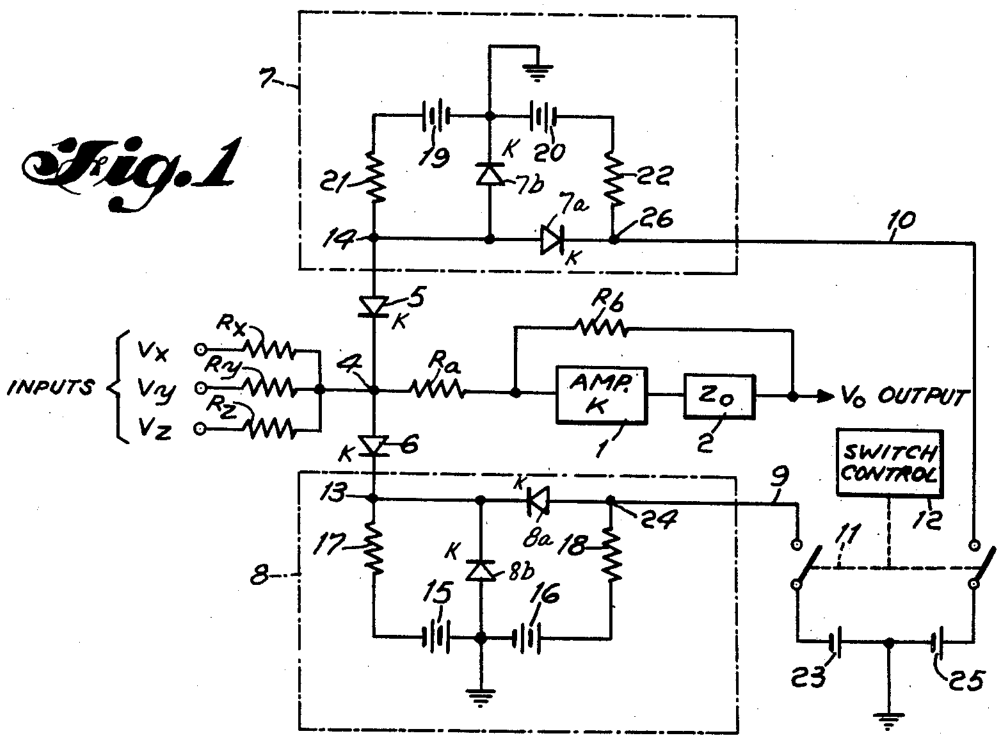
Figure 2:
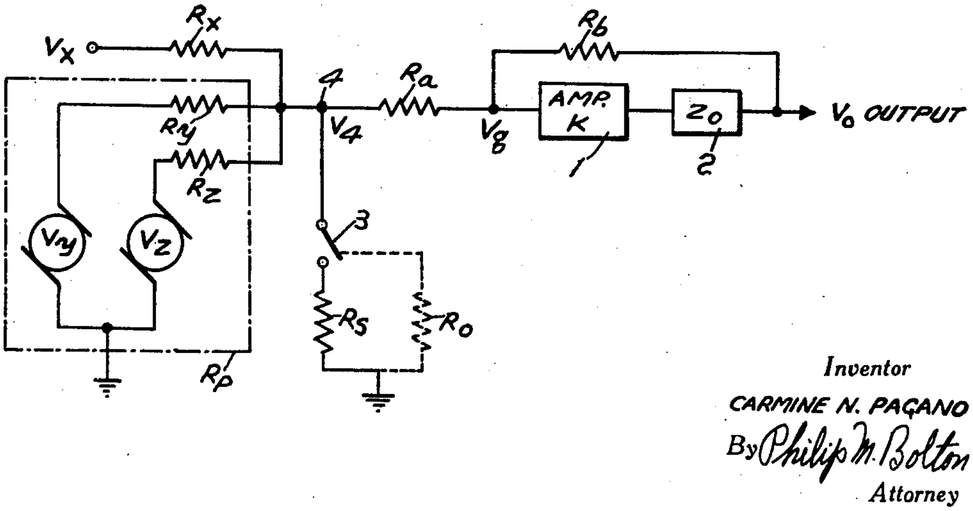

Other and further features and objects of this invention will be more apparent from the following specific description of an embodiment of the invention taken in conjunction with the figures, in which:

FIG. 1 depicts a feedback amplifier for summing voltages $V_x$, $V_y$ and $V_z$ having gating means for reducing the gain of the amplifier by a predetermined amount during controlled intervals; and FIG. 2 depicts a simplified diagram whereby an understanding of the operation of the amplifier and gate shown in FIG. 1 may be had.

Turning first to FIG. 2 for an understanding of the principle involved, there is shown a feedback amplifier 1 having a gain K, an output impedance $Z_0$ in the absence of feedback, denoted 2, with feedback resistance $R_b$ coupling said output impedance to the input of said amplifier. Assume that the purpose of this amplifier is to sum the voltages $V_x$, $V_y$ and $V_z$ so that output voltage $V_0$ is proportional to the summation of said input voltages, and suppose also that it is desired to gate the inputs to said amplifier during controlled intervals so as to attenuate the contribution of input $V_x$ at the amplifier's output. For this purpose switch 3 having an impedance $R_s$ is provided coupling the common junction 4, at potential $V_4$, to ground. Assume also that $R_p$ represents the impedance from summing junction 4 through all inputs other than $V_x$, to ground, such as through inputs $V_y$ and $V_z$ and, thus, the impedance to ground which would exist if switch 3 were removed. Furthermore, assume that $R_0$ represents the impedance from junction 4 through switch 3 to ground when the switch is open. In order not to open-circuit the feedback current from resistor $R_b$ to ground when switch 3 is closed, resistance $R_a$ is inserted between the input to amplifier 1 at potential $V_g$, and the summing junction 4. Now consider only one of the inputs say, for example $V_x$, and assume it is desirable to attenuate the gain, $K_x$ of the system in amplifying signal $V_x$, by a factor $A_x$ so that the gain of amplifier 1 with regard to signal input $V_x$, when switch 3 is closed, can be represented by $A_x \cdot K_x$.

Looking in an electrical direction, in from $V_x$, and assuming that switch 3 and its impedance when open and closed, $R_0$ and $R_s$, are removed, the following equations can be written:

$$\frac{V_x}{R_x}+\frac{V_g}{R_a}=V_4\left(\frac{1}{R_x}+\frac{1}{R_p}+\frac{1}{R_a}\right) \tag{1}$$

$$\frac{V_4}{R_a}+\frac{V_0}{R_b}=V_g\left(\frac{1}{R_a}+\frac{1}{R_b}\right) \tag{2}$$

$$\frac{V_g}{R_b}-\frac{K}{Z_0}=V_0\left(\frac{1}{R_b}+\frac{1}{Z_0}\right) \tag{3}$$

By algebra the above Equations 1, 2, and 3 can be shown to yield the following expression $$\frac{V_x}{R_x}(Z_0-KR_b)=V_0\left[\frac{(R_b+Z_0)+R_a(1+K)}{R_x}+\frac{R_b+Z_0+R_a(1+K)}{R_p}+(1+K)\right] \tag{4}$$

And solving Equation 4 for $V_0/V_x$ which is equivalent to $K_x$, the following is obtained:

$$K_x=\frac{V_0}{V_x}=\frac{Z_0-K\cdot R_b}{(R_b+Z_0)\left(1+\frac{R_x}{R_p}\right)+\left[R_a\left(1+\frac{R_x}{R_p}\right)+R_x\right](1+K)} \tag{5}$$

Now as a rule K is very large and the number of inputs such as $V_x$, $V_y$ and $V_z$ is very small, thus the second term summed in the denominator of Equation 5 is very much larger than the first and therefore the first can be ignored to yield a simplification of Equation 5 as follows:

$$K_x=\frac{Z_0-KR_b}{\left[R_a\left(1+\frac{R_x}{R_p}\right)+R_x\right](1+K)} \tag{6}$$

From Equation 6 a similar equation can be obtained expressing the gain from input $V_x$ to $V_0$ when switch 3 is connected to terminal 4 and the switch is closed.

$$A_xK_x=\frac{Z_0-KR_b}{R_a\left[1+R_x\left(\frac{R_p+R_s}{R_p\cdot R_s}\right)+R_x\right](1+K)} \tag{7}$$

Also, when switch 3 is open, the gain equation is identical except $R_0$ is substituted for $R_s$.

$$K_x=\frac{Z_0-KR_b}{R_a\left[1+R_x\left(\frac{R_p+R_0}{R_pR_0}\right)+R_x\right](1+K)} \tag{8}$$

Now Equation 8 may be multiplied by $A_x$ and equated to Equation 7 to yield the following expression for $R_a$ in terms of the desired $A_x$, $R_x$, $R_p$, $R_s$ and $R_0$:

$$R_a=\frac{R_x(1-A_x)}{A_x-1+R_x\left[A_x\left(\frac{R_p+R_s}{R_p\cdot R_s}\right)-\frac{R_p+R_0}{R_p\cdot R_0}\right]} \tag{9}$$

Turning next to FIG. 1, there is shown the same amplifier 1 having output impedance $Z_0$ in absence of feedback and having feedback resistor $R_b$ coupling said impedance to the input of said amplifier, voltages $V_x$, $V_y$ and $V_z$ feeding common summing junction 4 via resistances $R_x$, $R_y$ and $R_z$, respectively, and having resistance $R_a$ coupling common junction 4 to the input of said amplifier. There is also shown in FIG. 1 diodes 5 and 6 coupled to summing junction 4, diode 5 being directed towards said junction and diode 6 being directed away from said junction. Each of these diodes are coupled to similar voltage dividing networks 7 and 8, respectively, and control voltages are applied to these networks via lines 9 and 10 from double pole control switch 11 actuated by switch control 12.

During operation when double pole switch 11 is opened, junction 13 of voltage divider 8 is maintained at a potential considerably more positive than $V_x$, $V_y$ or $V_z$ or their summation, while at the same time junction 14 in voltage divider 7 is maintained at a negative voltage of the same absolute magnitude so that neither diodes 5 nor 6 conduct. Obviously, batteries 15 and 16 and resistances 17 and 18 in voltage divider 8 and batteries 19 and 20 and resistances 21 and 22 in voltage divider 7 must be of appropriate values so as to achieve the above-described conditions at junctions 13 and 14.

More specifically, when switch 11 is open diode *8a* is rendered conductive and exhibits a low resistance due to the manner it is connected in the circuit relative to the polarity of batteries 15 and 16. The conduction of diode *8a* effectively connects the resistors 17 and 18 in a voltage dividing arrangement and effectively connects points 13 and 24 together. The selection of the value of resistors 17 and 18 and batteries 15 and 16 will establish the desired positive potential at point 13 to maintain diode 6 nonconductive. The positive potential at point 13 maintains diode *8b* nonconductive. In a like manner junction 14 is provided with its negative potential. Namely, diode *7a* is rendered conductive and, hence, exhibits a low resistance due to its connection in the circuit relative to the polarities of batteries 19 and 20. The conduction of diode *7a* effectively connects points 14 and 26 together and thereby connects resistors 21 and 22 in a voltage dividing arrangement. The selection of the value of resistors 21 and 22 and batteries 19 and 20 establishes the desired negative potential at point 14 to maintain diodes 5 and *7a* nonconductive.

When double pole switch 11 is closed, an additional current path is provided from battery 16 through resistor 18 to battery 23, thus decreasing the potential at junctions 24 and 13. Likewise, and in the same manner an additional current path is provided from battery 20 through resistor 22 to battery 25 causing an increase in voltage at junction 26 of voltage divider 7 and, thus, an increase in the voltage at junction 14.

More specifically, when switch 11 is closed battery 23 has a sufficient negative value to reduce the potential at point 24 relative to the potential at point 13 to render diode *8a* nonconductive thereby reducing the potential at point 13 to a value sufficient to render diodes 6 and *8b* conductive, thereby effectively placing junction 4 at ground potential. Battery 25 has a positive value sufficient to increase the potential at point 26 relative to the potential at point 14 to cut off diode *7a*, thereby increasing the potential at point 14 to a value sufficient to render diodes 5 and *7b* conductive and, thus, effectively ground junction 4.

It will be obvious that diodes 5, 6, *8b*, and *7b* could be considered to constitute a conventional diode bridge circuit whose conduction is controlled by the potential of battery 20 the value of resistor 22 and the control voltage coupled over conductor 10 and the value of battery 16 and resistor 18 and the control voltage coupled over conductor 9.

When the potentials at junctions 13 and 14 decrease and increase, respectively, in the above described manner as a result of closing double pole switch 11, diodes 5 and 6 will be caused to conduct and, provided corresponding components in each of the voltage dividers 7 and 8 are of the same value, the potential at summing junction 4 will be maintained at ground while switch 11 remains closed.

The embodiment shown in FIG. 1 may be related to the simplified circuit shown in FIG. 2 so as to employ Equation 9 to establish the value of $R_a$ required to achieve a predetermined attenuation of each of the signals $V_x$, $V_y$ and $V_z$ as summed and represented by the output $V_0$, by employing three equations each involving a different one of the three inputs $V_x$, $V_y$, and $V_z$. For example, in the equation involving $V_x$, $R_p$ would represent the parallel combination of inputs $V_y$, and $V_z$ to ground from summing junction 4, $R_s$ is the forward impedance of one of the identical diodes 5 or 6 and $R_0$ is infinite since diodes 5 and 6 can be assumed to provide perfect blocks when reverse biased. Thus, Equation 9 above as applied to $V_x$ input of the circuit in FIG. 1 is as follows:

$$R_a=\frac{R_x(1-A_x)}{(A_x-1)+R_x\left(A_x\cdot\frac{R_p+R_s}{R_p\cdot R_s}-\frac{1}{R_p}\right)} \tag{10}$$

Similar expressions to Equation 10 may be written in terms of input resistances $R_y$ and $R_z$ yielding Equations 11 and 12 below.

$$R_a=\frac{R_y(1-A_y)}{(A_y-1)+R_y\left(A_y\cdot\frac{R_p+R_s}{R_p\cdot R_s}-\frac{1}{R_p}\right)} \tag{11}$$

$$R_a=\frac{R_z(1-A_z)}{(A_z-1)+R_z\left(A_z\cdot\frac{R_p+R_s}{R_p\cdot R_s}-\frac{1}{R_p}\right)} \tag{12}$$

The above Equations 10, 11 and 12 may be solved simultaneously provided $A_x$, $A_y$ and $A_z$ are known and at least one of impedances $R_x$, $R_y$ or $R_z$ is chosen, say for example $R_x$, yielding a solution for $R_a$, $R_y$ and $R_z$. It should be noted that $R_p$ in each Equation 10, 11 and 12 represents the parallel impedance to ground from junction 4 of all inputs other than the particular input that each equation is concerned with. In many instances it is desirable that $A_x$, $A_y$ and $A_z$ be equal thus simplifying the simultaneous solution of Equations 10, 11 and 12. Once the impedance $R_a$ is computed, feedback impedance $R_b$ can be determined from Equations 2 and 3. When point 4 is placed substantially at ground potential, then there is still an output at $V_0$, but there is a different attenuation of each of the input signals as set forth in Equations 10 , 11 and 12. There is no actual shorting of point 4 to ground at any time insofar as that may imply direct electrical coupling of one point to another.

Obviously, voltage dividers 7 and 8 can also be coupled to other pairs of diodes coupled to the summing junction of other summing amplifiers in the same manner as diodes 5 and 6 are coupled to junction 4, so that inputs to numerous amplifiers may be gated in the same manner and while there is shown in the several figures of the drawings embodiments of this invention, other circuits may be substituted for those shown without deviating from the spirit or scope of the invention as expressed in the claims.

I claim:

1. A device for gating the input signals to a feedback amplifier having negative feedback impedance coupling the output to the input thereof comprising a separate impedance coupling each of said input signals to a common junction, an impedance coupling said common junction to said amplifier input, first voltage dividing means producing a positive potential at a first terminal, second voltage dividing means producing a negative potential at a second terminal, unidirectional conductive devices coupling said first and second terminals to said common junction and switching means for applying control signals to said first and second voltage dividers, switch control means coupled to said switching means for controlling said switching means at controlled intervals whereby the potentials at said first and second terminals may be controlled so that the potential at said common junction is placed substantially at ground during said controlled intervals, the value of said impedance coupling said common junction to said amplifier being a function of said separate impedances and the impedance of said voltage dividing means together with said unidirectional conductive devices.

2. In a summing amplifier having a negative feedback impedance coupling the output to the input thereof and a common junction to which a plurality of input signals are fed, controlled means for gating said inputs so as to attenuate each in the output from said amplifier comprising an impedance coupling said common junction to said amplifier input, means for producing potentials of equal value but opposite sign, unidirectional conductive devices coupling said means for producing potentials to said common junction and switching means for applying control signals to said means for producing potentials, switch control means coupled to said switching means for controlling said switching means at controlled intervals whereby said potentials may be controlled so that said common junction is placed at substantially ground potential during said controlled intervals thereby attenuating each of said input signals in the output of said amplifier, the value of said impedance coupling said common junction to said amplifier input being a function of the impedance of said inputs to said common junction and the impedance of said potential producing means together with said unidirectional conductive devices.

3. A negative feedback amplifier for summing a multitude of input signals and having means for altering the gain thereof with respect to each of said input signals comprising a separate input impedance coupling each of said input signals to a common junction, impedance means coupling said junction to the input of said amplifier, a first voltage divider producing a positive potential at a first terminal, a second voltage divider producing a negative potential at a second terminal, unidirectional conductive means coupling each of said terminals to said junction and switching means coupled to each of said voltage dividers for altering the potentials at said junctions switch control means coupled to said switching means for controlling said switching means at controlled intervals so that said unidirectional conductive devices are caused to conduct during said controlled intervals placing said common junction at essentially ground potential, the value of said impedance means coupling said junction to the input of said amplifier being a function of said separate input impedances and the impedance of said voltage dividers together with said unidirectional conductive means.

References Cited in the file of this patent

UNITED STATES PATENTS

| | | |
|---|---|---|
| 2,189,549 | Hershberger | Feb. 6, 1940 |
| 2,692,333 | Holmes | Oct. 19, 1954 |
| 2,741,668 | Iffland | Apr. 10, 1956 |
| 2,759,998 | Labin et al. | Aug. 21, 1956 |
| 2,761,130 | Kibler | Aug. 28, 1956 |
| 2,775,714 | Curtis | Dec. 25, 1956 |
| 2,782,307 | Von Sivers et al. | Feb. 19, 1957 |
| 2,789,761 | Merrill et al. | Apr. 23, 1957 |
| 2,820,897 | Dean et al. | Jan. 21, 1958 |
| 2,829,251 | Patton | Apr. 1, 1958 |
| 2,831,107 | Raymond et al. | Apr. 15, 1958 |
| 2,851,617 | Walker | Sept. 9, 1958 |
| 2,868,969 | Inniss | Jan. 13, 1959 |
| 2,888,523 | Ross | May 26, 1959 |
| 2,888,636 | McManis | May 26, 1959 |
| 2,891,172 | Bruce et al. | June 16, 1959 |
| 2,897,359 | Raymond et al. | July 28, 1959 |
| 3,028,487 | Losee | Apr. 3, 1962 |

FOREIGN PATENTS

| | | |
|---|---|---|
| 529,970 | Canada | Sept. 4, 1956 |
| 754,945 | Great Britain | Feb. 11, 1954 |

OTHER REFERENCES

Mather: Electronics, July 1947, pages 11–113.

Landee et al.: Electronic Designer's Handbook, McGraw-Hill, 1957, pages 3–79 to 3–86 relied on.

Korn et al.: Electronic Analog Computers, McGraw-Hill, 1952, pages 159 to 164, 200 to 204, 289 to 290 relied on.